United States Patent [19]
Yang

[11] Patent Number: 5,624,857
[45] Date of Patent: *Apr. 29, 1997

[54] PROCESS FOR FABRICATING DOUBLE WELL REGIONS IN SEMICONDUCTOR DEVICES

[75] Inventor: Sheng-Hsing Yang, Hsinchu, Taiwan

[73] Assignee: United Microelectronics Corporation, Hsinchu, Taiwan

[*] Notice: The term of this patent shall not extend beyond the expiration date of Pat. No. 5,413,944.

[21] Appl. No.: 422,298

[22] Filed: Apr. 14, 1995

[51] Int. Cl.$^6$ ............... H01L 21/8238; H01L 21/761
[52] U.S. Cl. ............... 438/420; 438/451; 438/228
[58] Field of Search ............... 437/34, 38, 56, 437/57, 70, 74; 148/DIG. 70

[56] References Cited

U.S. PATENT DOCUMENTS

| | | | |
|---|---|---|---|
| 4,929,565 | 5/1990 | Parrillo | 437/34 |
| 5,300,797 | 4/1994 | Bryant et al. | 437/34 |
| 5,413,944 | 5/1995 | Lee | 437/34 |

*Primary Examiner*—Chandra Chaudhari
*Attorney, Agent, or Firm*—Townsend and Townsend and Crew LLP

[57] ABSTRACT

A process for fabricating double well regions for a semiconductor device having a first well region of a first type and a second well region of a second type on the substrate is disclosed. The process comprises the steps of first implanting impurities of the first type into the substrate. Then a shielding layer covering the location designated for the first well region of the first type on the substrate is formed. Impurities of the second type are then implanted into the substrate at locations not covered by the shielding layer and designated for the formation of the second well region of the second type. Finally, the impurities of both the first and the second type are driven into a designated depth of the substrate by a heating process to form the first well region of the first type and the second well region of the second type.

8 Claims, 6 Drawing Sheets

1

PROCESS FOR FABRICATING DOUBLE WELL REGIONS IN SEMICONDUCTOR DEVICES

BACKGROUND OF THE INVENTION

1. Field of the Invention

The present invention relates in general to a process for fabricating double well regions in semiconductor devices. In particular, the present invention relates to a process for fabricating double well regions in a semiconductor device that requires reduced fabrication time.

2. Technical Background

Conventional semiconductor devices having double well regions are made by growing a well region oxide layer in the designated location before a well region is formed. The formed well region is then utilized a shield layer for forming a second well region. This process characteristically requires a great deal of manufacturing time that not only increases cost but also limits the production volume.

FIGS. 1a–1f of the accompanying drawing of the present invention depict the process of fabrication of the double well-region devices in accordance with the conventional method. The drawings of FIGS. 1a–1f schematically show the cross-sectional views of the structural configuration of the semiconductor device having double well regions fabricated in accordance with the prior art techniques as selected from the process stages of its fabrication.

In the conventional process, it is well known that to fabricate a device with double well regions, a pad oxide layer 11 is first prepared on the substrate 1, as is seen in FIG. 1a. A layer of nitride 12 is then deposited to cover the pad oxide layer 11. Then, a photomask 13 is formed, shielding designated areas of the nitride layer 12, so that the exposed portions of the nitride layer 12 may be subjected to a process of etching and removal. An ion implantation process is then conducted to implant N-type impurities into areas of the substrate 1 not being shielded by both the nitride layer 2 and photomask 13. At this stage, the substrate 1 exhibits a configuration as shown in FIG. 1a.

Refer next to FIG. 1b. Utilizing the layer of nitride 12 as a shielding, an oxidation process is implemented to form a well region oxide layer 14. The nitride layer 12 is then removed.

At FIG. 1c, the well-region oxide layer 14 is now utilized as shielding for controlled implantation of P-type impurities into areas of the substrate 1 not shielded by the layer 14. A heating process then drives both the N and P impurities into the controlled depth of the substrate 1, forming the N-type well region 15 and the P-type well region 16. The well region oxide layer 14 and the pad oxide layer 11 may then be removed.

Refer next to FIG. 1d. A series of processing steps similar to those employed in the fabrication of the configuration of FIG. 1a is implemented. Namely, another pad oxide layer 17 is now grown to cover the surface of the substrate 1 at this stage, and then another nitride layer 18 is deposited thereon. Further, a photomask 19 is then formed to cover the required area of the surface which is utilized as the shielding for an etching process that removes the portions of nitride layer 18 not covered by the photomask 19. This achieves the configuration of FIG. 1d, and the photomask 19 may then be removed.

Next, in FIG. 1e, another photomask 20 is formed to cover the designated area of the configuration, so that ion implantation can be implemented to bring P-type impurities into the controlled depth of the P-type well region 16. This forms a channel stop region 21 for the subject device being fabricated. Then, the photomask 20 is removed.

Then, in FIG. 1f, the nitride layer 18 is utilized as a shielding for implementing an oxidation procedure, so that a well region oxide layer 22 may be formed on top of both the N-type well region 15 and the P-type well region 16, in the configuration as schematically shown in FIG. 1f.

The above-described process makes a double well-region device, as depicted in the drawing. However, this conventional process involves the steps for fabricating the well region oxide layer, namely the oxide layer 14 is formed in a thermal oxidation process that is necessary in the described prior art process for the formation of the P-type well region 16. Such thermal oxidation procedure is time-consuming, constituting a serious drawback to the entire device fabrication procedure. The result is increased process time that is directly translated into the increased fabrication cost, and restrained production volume.

SUMMARY OF THE INVENTION

It is therefore a primary object of the present invention to provide a process for fabricating double-well region semiconductor devices with simplified fabrication steps and reduced processing time requirements.

The present invention achieves the above-identified objects by providing a process for fabricating double well regions for a semiconductor device having a first well region of a first type and a second well region of a second type on the substrate. The process comprises the steps of first implanting impurities of the first type into the substrate. Then a shielding layer covering the location designated for the first well region of the first type on the substrate is formed. Impurities of the second type are then implanted into the substrate at locations not being covered by the shielding layer and designated for the formation of the second well region of the second type. Finally, the impurities of both the first and the second type are driven to a designated depth of the substrate by a heating process to form the first well region of the first type and the second well region of the second type.

BRIEF DESCRIPTION OF THE DRAWING

Other objects, features and advantages of the present invention will become apparent by way of the following detailed description of the preferred but non-limiting embodiment. The description is made with reference to the accompanied drawings, wherein.

DETAILED DESCRIPTION OF THE PREFERRED EMBODIMENT

Figure 1A:
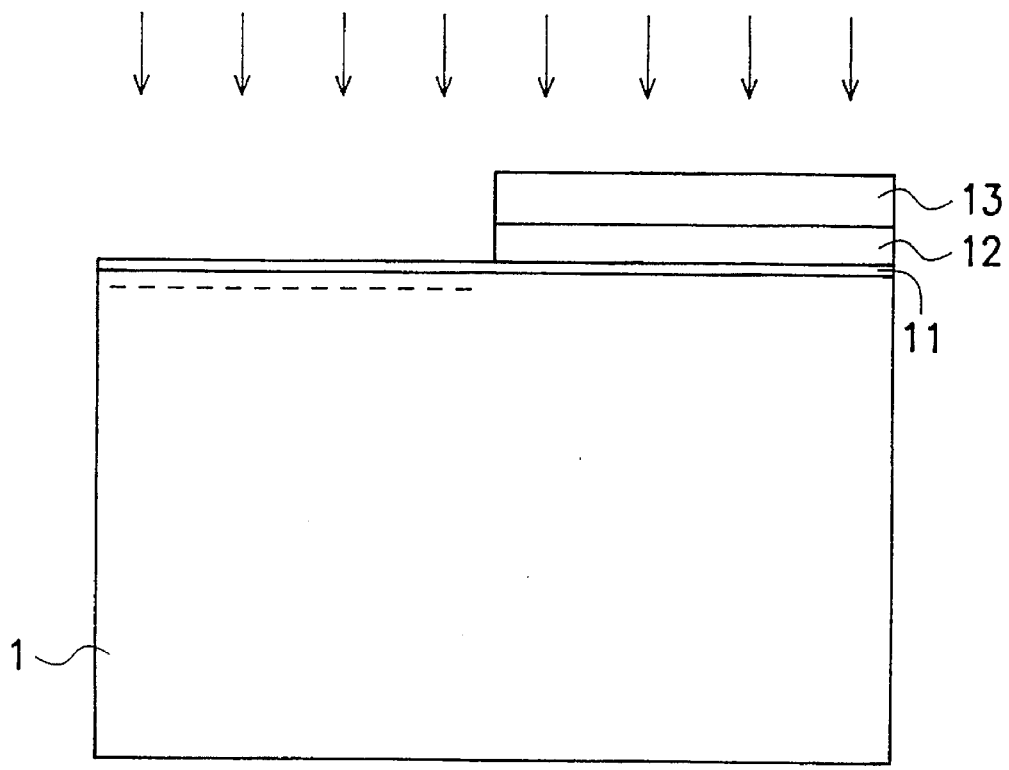
FIGS. 1a–1f schematically show the cross-sectional views of the structural configuration of the semiconductor device having double well regions fabricated in accordance with the prior art techniques as selected from the process stages of its fabrication.
Figure 1B:
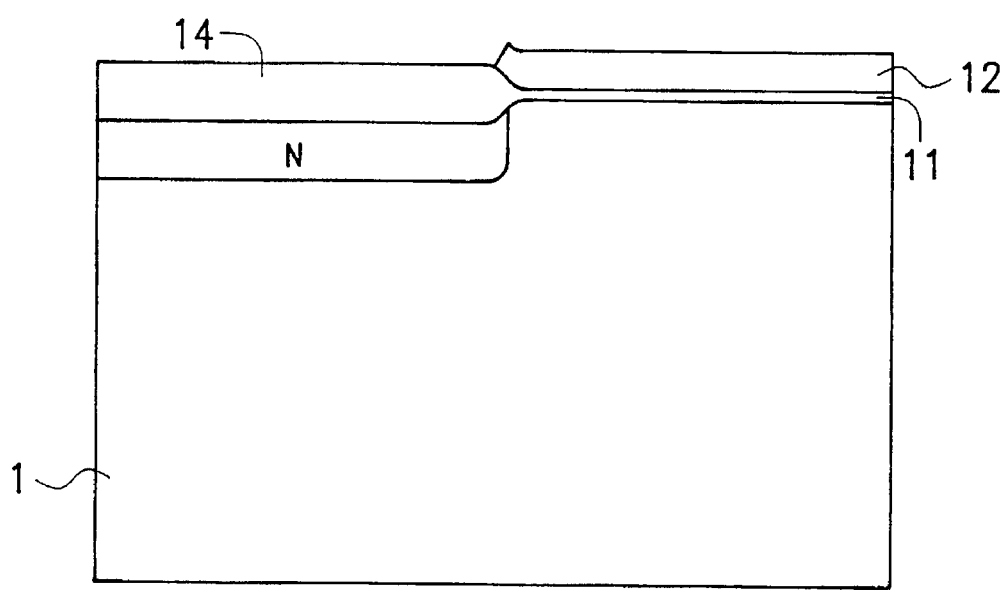
Figure 1C:
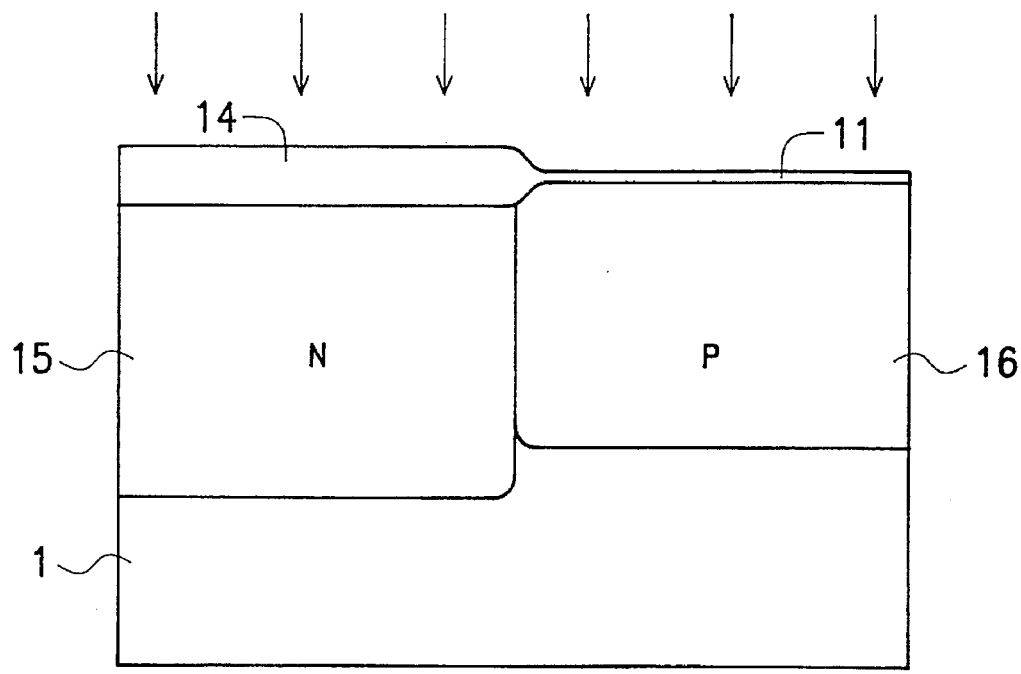
Figure 1D:
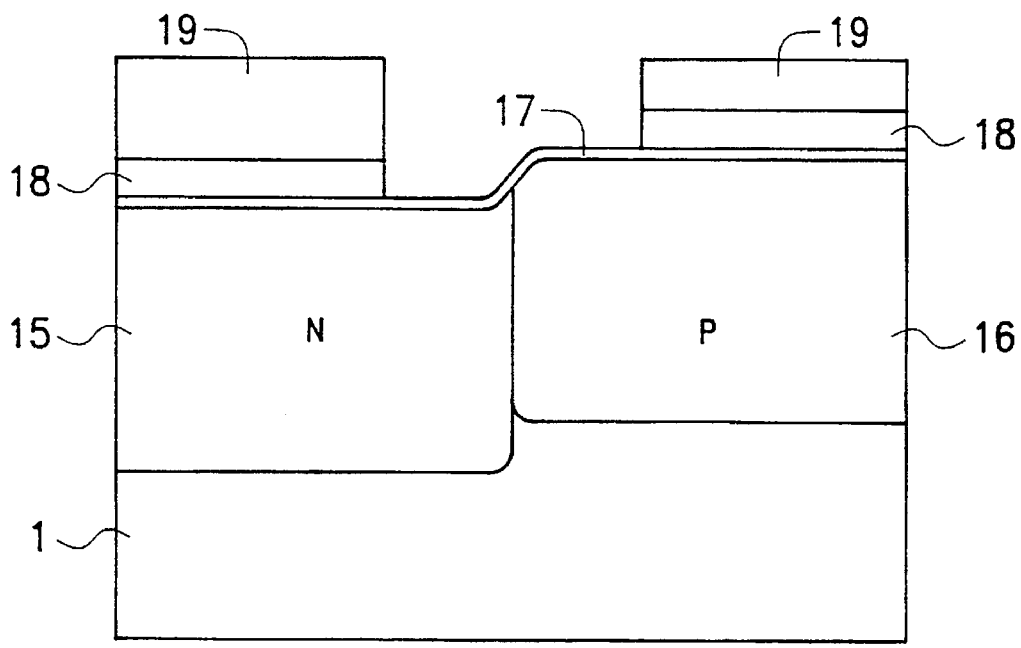
Figure 1E:
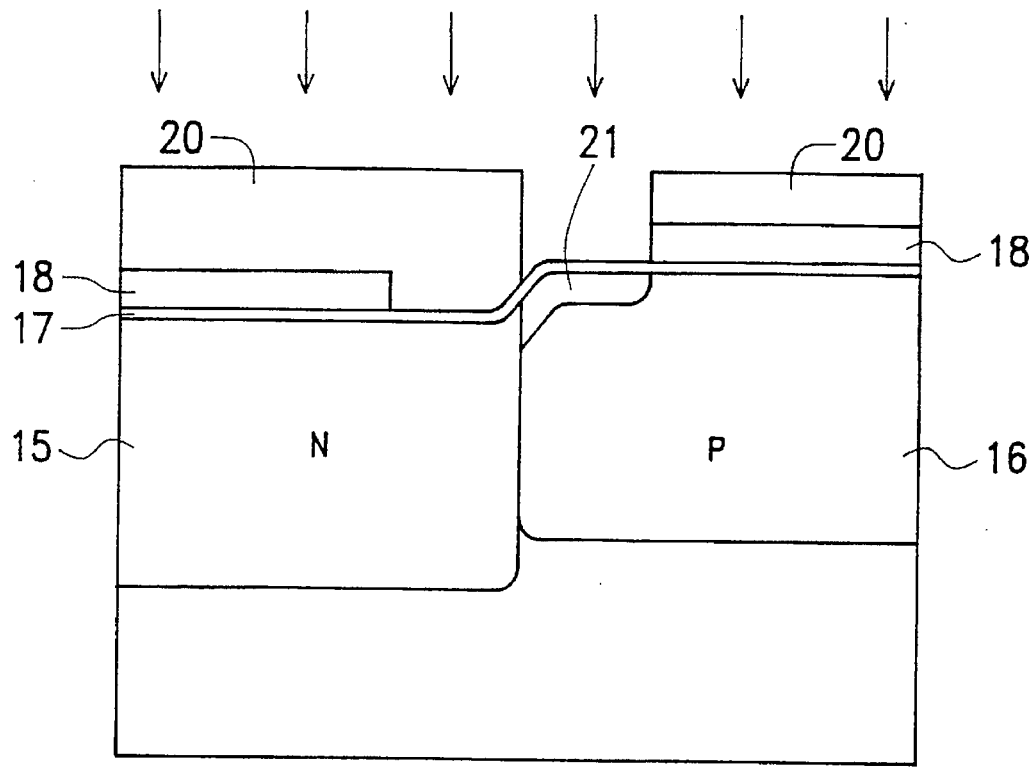
Figure 1F:
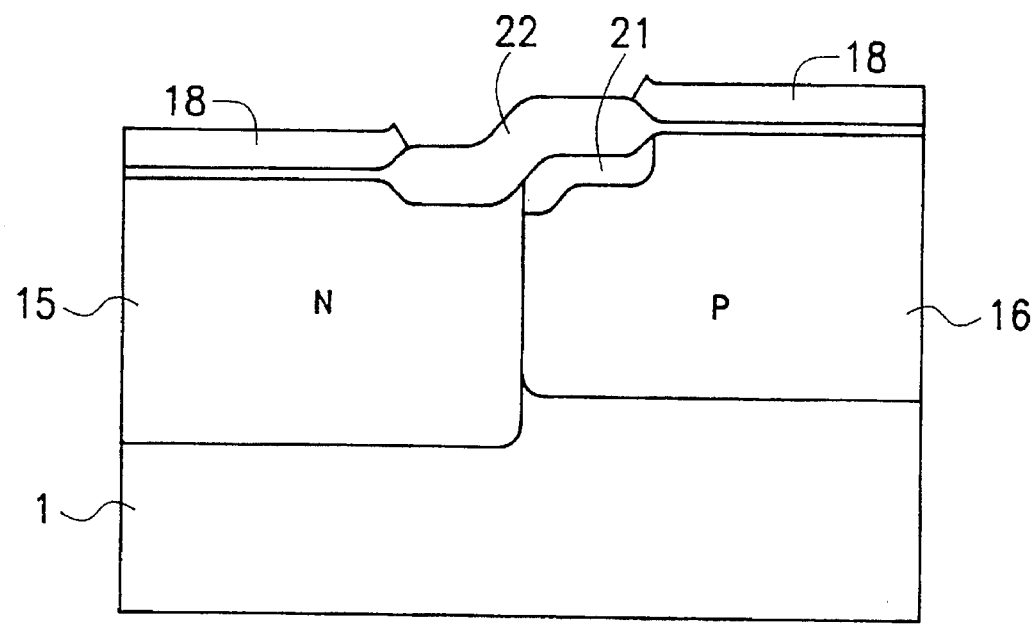

For the description of the innovative process for fabricating double well-region semiconductor devices of the present invention, reference is made to FIGS. 2a–2f of the drawing. FIGS. 2a–2f schematically show the cross-sectional views of the structural configuration of the semiconductor device having double well regions fabricated in accordance with a preferred embodiment of the present invention as selected from the stages of fabrication.

Figure 2A:
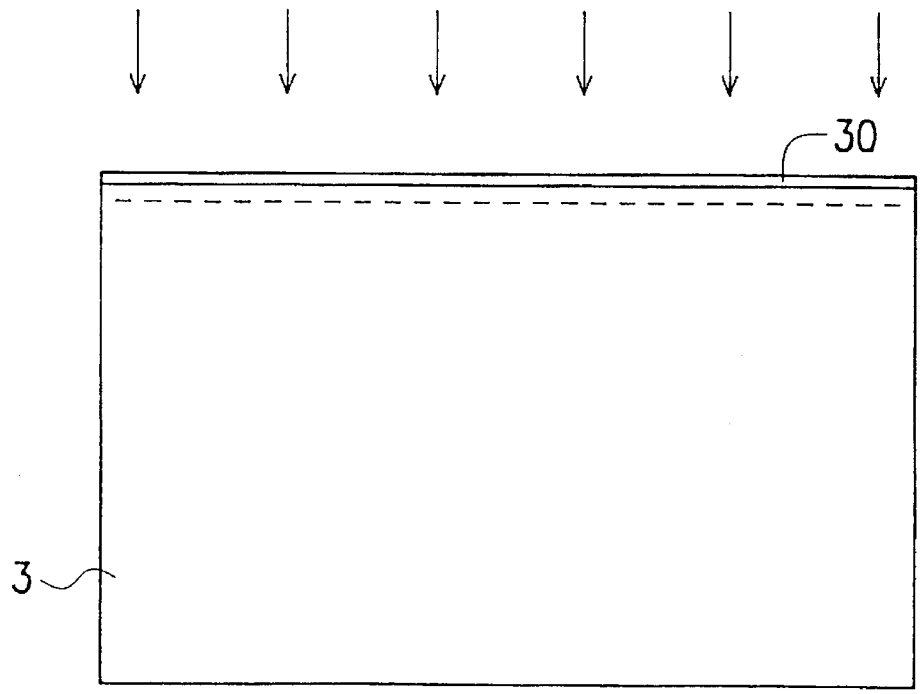
FIGS. 2a–2f schematically show the cross-sectional views of the structural configuration of the semiconductor device having double well regions fabricated in accordance with a preferred embodiment of the present invention as selected from the process stages of the fabrication.

Step 1:

At FIG. 2a, a semiconductor substrate 3 tailored to properly suit the requirement that the semiconductor device be fabricated with double well regions is subjected to an ion implantation process, so that impurities of the first type may be implanted in to the controlled depth of the substrate 3. This may be achieved by conducting the growth of a pad oxide layer 30 covering the top surface of the substrate 3, and N-, or P-type impurities may be implanted in an ion implantation procedure. Note that the implanted impurities may be either N- or P-type, although N-type is selected for the description of the present invention, as in the presented embodiment.

Figure 2B:
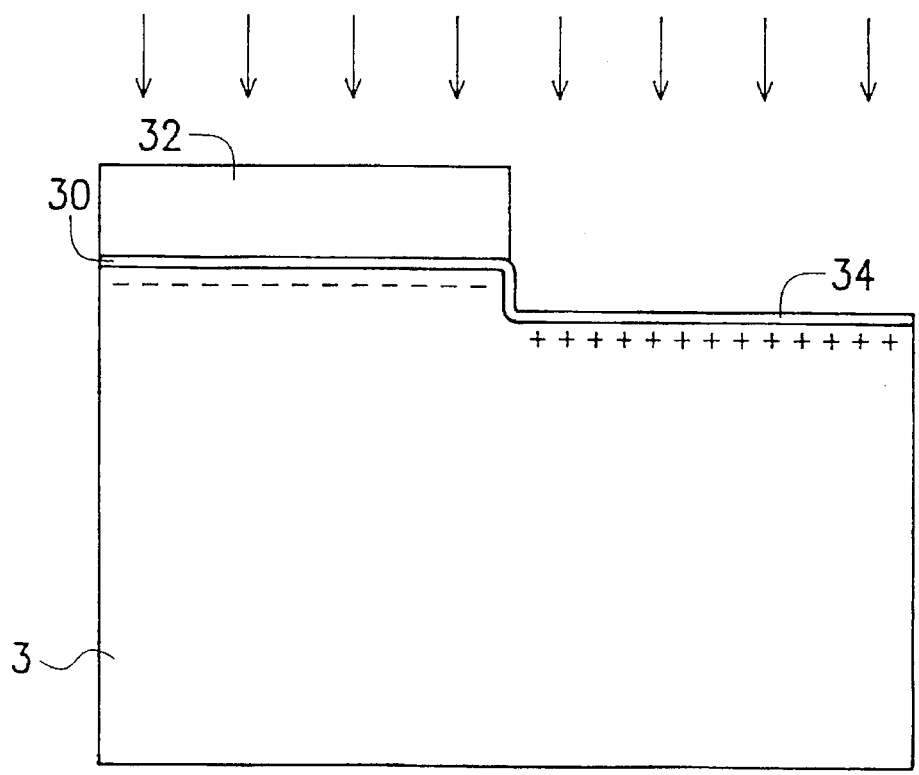

Step 2:

In FIG. 2b, on the top surface of the substrate 3, which is now covered by the pad oxide layer 30, a shielding layer 32, such as a photomask layer, is formed at the location where a well-region of a first type is to be fabricated. The shielding layer 32 may be utilized as the shield that protects the area for the well region underneath itself, when an etching procedure is conducted to remove all the area exposed beyond the shielding. A thin oxide layer 34 may then be formed to cover the area exposed by the etching process.

The etching is controlled to reach to the a depth of the thickness of the substrate 3, so that the impurities of the first type implanted in Step 1 are removed. Then, another ion implantation procedure may be conducted to implant impurities of a second type in to the controlled depth of the substrate 3 at locations exposed beyond the coverage of the shielding layer 32.

Note that the etching procedure is not mandatory. After the formation of the shielding layer 32, defining the location for the well region of the first type, the ion implantation process for the impurities of the second type may be implanted directly in to the depth of the exposed area. While the concentration of the impurities of the second type may be controlled to reach a level that is sufficiently large, the combined effect would be equivalent to the removal of the thickness of the top end of the substrate 3 that was previously implanted with a first type impurity.

Figure 2C:
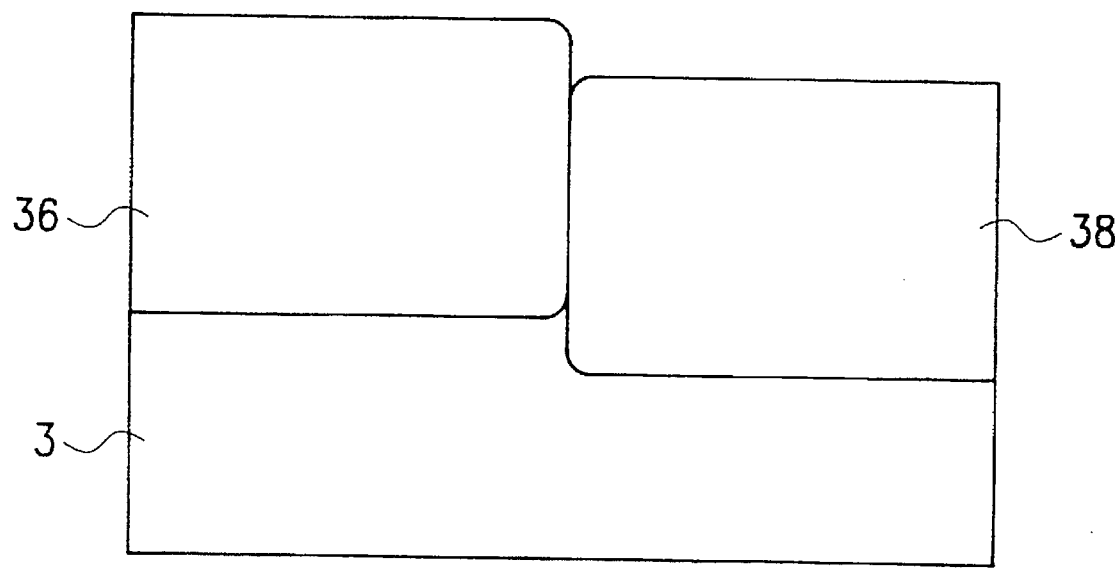

Step 3:

In FIG. 2c, the impurities of both the first and second type are driven deeper into the depth of the substrate 3 by, for example, a heating process. This forms the well regions 36 and 38 of the first and second type. At this stage, the shielding layer 32 as well as the pad oxide layer 30 and the thin oxide layer 34 may be removed.

Figure 2D:
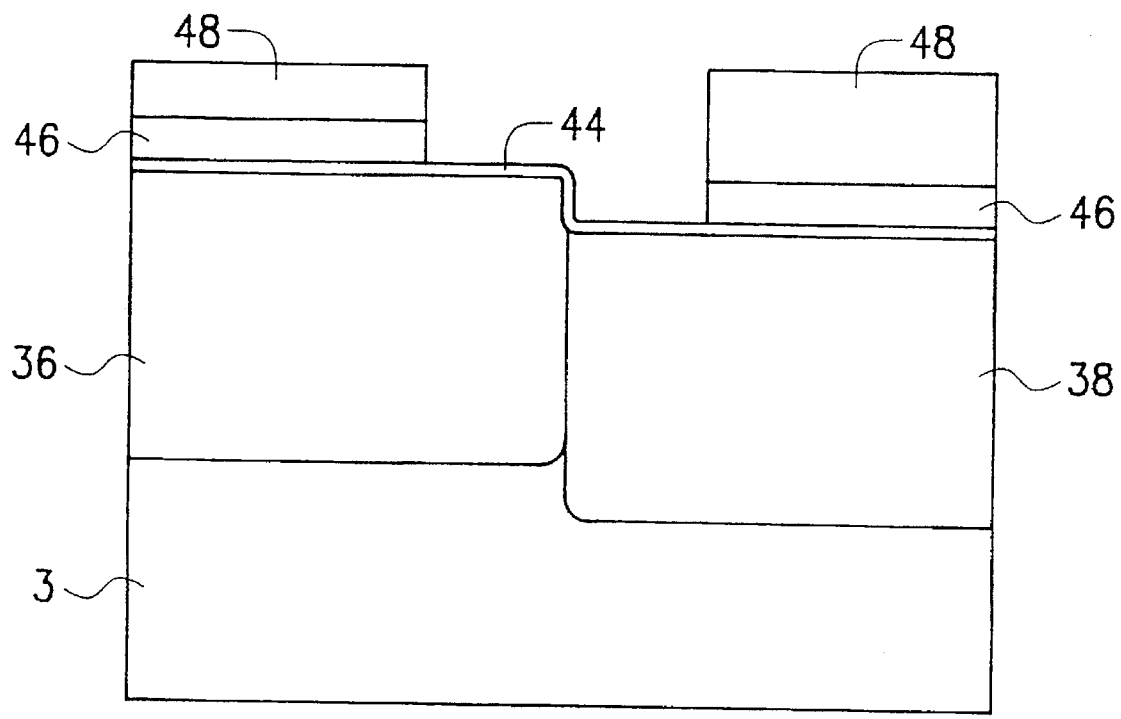
Figure 2E:
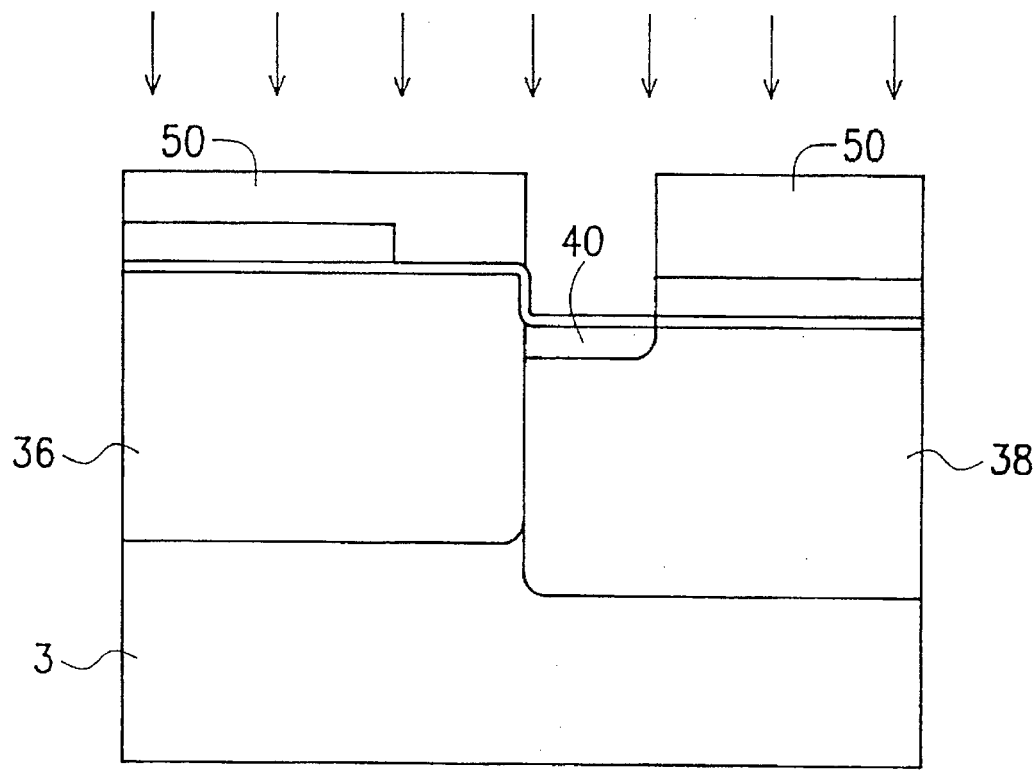
Figure 2F:
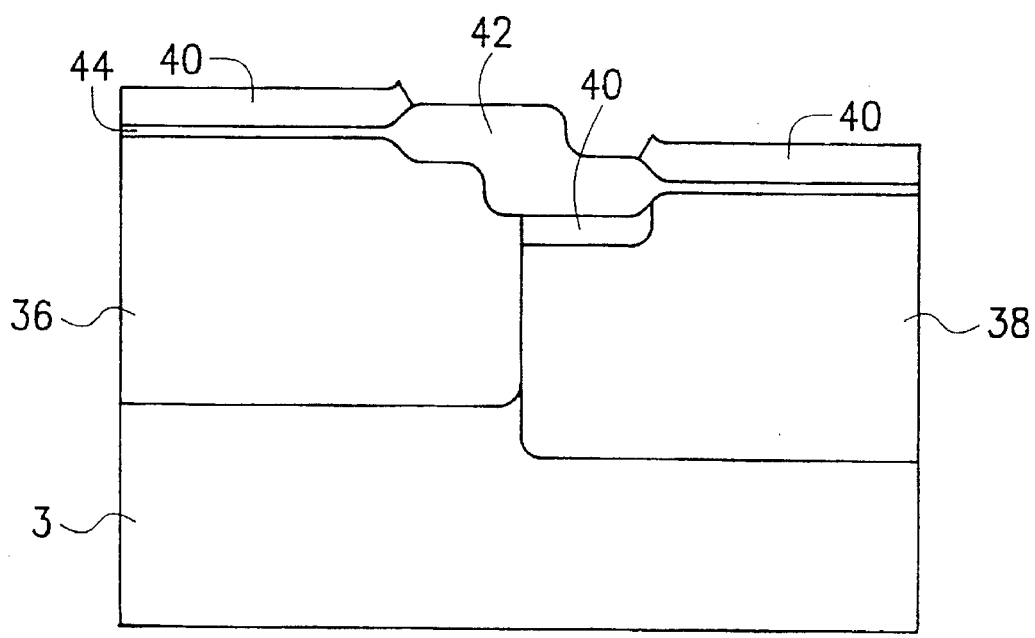

Step 4:

Refer next to FIGS. 2d, 2e and 2f subsequently. As is necessary for the fabrication of the subject semiconductor device, a channel stop region 40 must be formed first, so that the field oxide layer 42 can be formed to define the active region for the device being fabricated, as would finally be shaped out in FIG. 2f.

To achieve this, as in FIG. 2d, a pad oxide layer 44 is formed on top of the substrate configuration at this stage, followed by the formation of another nitride layer 46. The pad oxide layer 44 may be formed by, for example, a growth procedure, while the nitride layer 46 may be formed by, for example, a deposition procedure.

Then, a shielding layer 48, such as, for example, a photomask having the required pattern, may be formed to cover designated locations of the substrate configuration.

With the presence of the shielding layer 48, a process of, for example, etching may be conducted to remove the entire thickness of the nitride layer 46 that is exposed beyond the shielding of the shielding layer 48. This achieves a configuration shown in FIG. 2d.

In FIG. 2e, another shielding layer 50 of, for example, photomask may then be formed to cover the designated surface areas of the substrate configuration with its predetermined pattern. The shielding layer 50 may then be utilized as the shield for conducting an ion implantation procedure, so that impurities of the second type may be driven into the controlled depth of the well region 38 of the second type. This forms the channel stop region 40 for the fabricated semiconductor device. After the formation of the channel stop region 40, the shielding layer 50 may be removed.

It is appreciable, for persons skilled in this art, that the channel stop region 40 may as well be formed within the well region 36 of the first type. This can be done by implanting impurities of the first type to the controlled depth of the defined area of the well region 36.

After the removal of the shielding layer 50, the nitride layer 46 may be further utilized as a shielding for conducting a controlled oxidation procedure that forms the field oxide layer 42, as shown in FIG. 2f. This completes the fabrication of the double well regions for the semiconductor device. As a result of the discarding of the formation of the field oxide layer that was necessary in the prior art process, the process of the present invention may be concluded in a relatively shorter time period.

The above-described preferred embodiment of the present invention is utilized only for the purpose of the description of the present invention. Persons skilled in this art can appreciate the fact that other similar arrangements can be devised from the embodiment disclosed above without departing from the spirit of the present invention, which is recited in the following claims.

What is claimed is:

1. A process for fabricating double well regions for a semiconductor device having a first well region of a first type and a second well region of a second type on the substrate of said semiconductor device, said process comprising the steps of:

implanting impurities of the first type into said substrate;

forming a shielding layer covering the location designated for said first well region of the first type;

implanting impurities of the second type into said substrate at locations not covered by said shielding layer and designated for the formation of said second well region of the second type; and driving said impurities of the first type and said impurities of the second type into a designated depth of said substrate to form said first well region of the first type and said second well region of the second type.

2. The process for fabricating double well regions for a semiconductor device of claim 1, wherein prior to the implementation of the implantation procedure implanting said impurities of the second type, the shielding layer is formed covering said substrate by the exposure of the location designated for said second well region of the second type, and a controlled depth of said substrate within said location of said second well region containing impurities of the first type is removed by etching utilizing said second shielding layer as a shielding layer.

3. The process for fabricating double well regions for a semiconductor device of claim 1, further comprising the steps of forming a field oxide layer covering said first well region of the first type and said second well region of the second type, wherein said field oxide layer defines an active region for said semiconductor device.

4. The process for fabricating double well regions for a semiconductor device of claim 2, further comprising the step of forming a field oxide layer covering said first well region of the first type and said second well region of the second type, wherein said field oxide layer defines an active region for said semiconductor device.

5. The process for fabricating double well regions for a semiconductor device of claim 3, further comprising the step of forming a channel stop region underneath said field oxide layer.

6. The process for fabricating double well regions for a semiconductor device of claim 4, further comprising the step of forming a channel stop region underneath said field oxide layer.

7. The process for fabricating double well regions for a semiconductor device of claim 1, wherein said first type is N type and said second type is P type.

8. The process for fabricating double well regions of a semiconductor device of claim 1, wherein said first type is P type and said second type is N type.

* * * * *